United States Patent [19]

Theisen et al.

[11] Patent Number: 5,266,411
[45] Date of Patent: Nov. 30, 1993

[54] METALLIZED POLYPROPYLENE FILM AND PROCESS FOR MANUFACTURE

[75] Inventors: Henry Theisen, New London; Kevin Nelson, Appleton, both of Wis.

[73] Assignee: Curwood, Inc., Oshkosh, Wis.

[21] Appl. No.: 977,146

[22] Filed: Nov. 16, 1992

Related U.S. Application Data

[62] Division of Ser. No. 610,528, Nov. 8, 1990, Pat. No. 5,206,051.

[51] Int. Cl.$^5$ ............................................. B32B 15/08
[52] U.S. Cl. ................................. 428/461; 428/910; 428/500
[58] Field of Search ............... 428/461, 910; 427/458; 204/38 B

[56] References Cited

U.S. PATENT DOCUMENTS

| | | | |
|---|---|---|---|
| 3,085,025 | 4/1963 | Eaton | 427/205 |
| 3,857,723 | 12/1974 | Haskell et al. | 428/422 |
| 3,930,109 | 12/1975 | Brandt et al. | 428/336 |
| 4,039,714 | 8/1977 | Roubal et al. | 428/336 |
| 4,197,337 | 4/1980 | Di Biasi et al. | 427/270 |
| 4,308,084 | 12/1981 | Ohtusuki et al. | 427/208.2 |
| 4,345,005 | 8/1982 | All et al. | 427/250 |
| 4,363,872 | 12/1982 | Ealding | 430/532 |
| 4,422,907 | 12/1983 | Birkmaier et al. | 204/38 B |
| 4,489,124 | 12/1984 | Watanabe | 428/220 |
| 4,508,786 | 4/1985 | Ishibashi et al. | 427/250 |
| 4,528,245 | 7/1985 | Jobbins | 428/457 |
| 4,546,046 | 10/1985 | Etzell et al. | 428/460 |
| 4,619,969 | 10/1986 | Doi et al. | 525/93 |
| 4,686,257 | 8/1987 | Mitsuno et al. | |
| 4,721,656 | 1/1988 | Vance et al. | |
| 4,803,097 | 2/1989 | Fraenkel et al. | 427/307 |
| 4,888,237 | 12/1989 | Balloni et al. | 427/223 |
| 5,019,442 | 5/1991 | Ogawa et al. | 428/215 |
| 5,164,267 | 11/1992 | D'Heur et al. | 428/516 |

Primary Examiner—Edith Buffalow
Attorney, Agent, or Firm—Lee, Mann, Smith, McWilliams, Sweeney & Ohlson

[57] ABSTRACT

This invention relates to a metallized polypropylene film made from polypropylene/acid terpolymer blends and the process for the manufacture thereof. The acid terpolymer is composed of an ester monomer, an acid monomer and ethylene.

11 Claims, No Drawings

METALLIZED POLYPROPYLENE FILM AND PROCESS FOR MANUFACTURE

This application is a division of U.S. patent application Ser. No. 07/610,528, filed Nov. 8, 1990 is now U.S. Pat. No. 5,206,051.

BACKGROUND OF THE INVENTION

Metallized polypropylene film is used in many packaging applications. Its advantages include low permeability to water vapor, brilliant appearance, low density and low cost. However, a major deficiency results from the relatively poor metal-to-polymer bond typically seen in prior art films.

While manufacturing techniques and polymer property requirements are known for the manufacture of metallized polypropylene film, various modifications have been employed to attempt to overcome the adhesion deficiency. These alterations have resulted in polypropylene surface changes. Some examples of these modifications include coextrusion with an adhesion promoting polymer, corona discharge or plasma treatment, application of very thin adhesion promoting solutions, dispersions or emulsions just prior to, during or after an orientation process and chemical etching of the film surface with acids, solvents or other reactive agents.

Although currently available biaxially oriented polypropylene films provide some improvement for metal adhesion over that given by a modified homopolymer film, many drawbacks are created. Chiefly, the processes for manufacture of these films involve greater complexity and increased cost. Also, the current processes limit the suitability for use of the film in subsequent converting operations. Specifically, the ability to successfully laminate two or more films by extrusion techniques may be compromised due to the tendency for the metallized layer to crack or craze. Crazing during the extrusion lamination process is a widespread problem which results in poor appearance as well as property deficiencies. It is known that unmodified metallized films do not exhibit this crazing phenomenon during the lamination process, however the metal to film adhesion is deficient.

Metal crazing is believed to be the result of differential stretching between the bulk film layer and the metal adhering layer brought about by heat and stresses introduced by the extrusion lamination process. With most commercial films, there is a trade-off between the ultimate metal bonds attainable and the craze resistance of the film.

SUMMARY OF THE INVENTION

The present invention provides a metallized polypropylene film and a process for producing it which significantly improves the film-to-metal bond without compromising the versatility of the subsequent converting operations which may be applied to the film. Specifically, films of this type may be processed via extrusion lamination techniques without susceptibility to metal cracking or crazing.

The bond improvement is achieved in accordance with the invention by blending polypropylene with an acid terpolymer. The homogeneous blend may then be processed as a single layer or coextruded as one of multiple layers, as long as the polypropylene/acid terpolymer blend comprises the surface to be metallized. A wide range of acid terpolymer compositions and addition levels have proven to effectively enhance the adhesion of the metal which is deposited onto the film surface.

DESCRIPTION OF THE PREFERRED EMBODIMENT

The present invention covers a metallized polypropylene film and the process for making it comprising blending polypropylene (including random and block copolymers) with an acid terpolymer. The acid terpolymer of the preferred embodiment consists of an ester monomer, an acidic monomer and ethylene. Several organic compounds have proven effective as the ester monomer component of the acid terpolymer. These compounds include: methyl acrylate, alkyl methacrylates wherein the alkyl group contains 1 through 8 carbons and alkyl hydrogen maleates wherein the alkyl group contains 1 through 8 carbons.

Several organic compounds have also proven effective as the acidic monomer component of the acid terpolymer. These include: acrylic acid, and maleic acid and maleic anhydride.

Several ratios of the ester monomer, acidic monomer and ethylene have proved satisfactory for use in the acid terpolymer ultimately used for the metallized biaxially oriented polypropylene film. These compositions are in the range of approximately 1–40 wt. % ester monomer, 0.5–10 wt. % acidic monomer and the balance ethylene. The preferred range is 1–10 wt. % ester monomer, 0.5–3 wt. % acidic monomer and the balance ethylene.

Acid terpolymers which have been successfully utilized are sold commercially by Exxon Chemical Company under the designation Escor acid terpolymers. The preferred acid terpolymer is sold under the designation LDX-244 and identified a grade XV-35.04. This terpolymer has been determined to be particularly effective when blended with polypropylene sold under the designation Exxon Escorene 4202, the resultant film being produced on Gloucester blown process orienting equipment.

The acid terpolymer can be blended with polypropylene in the ratios discussed herein to provide the desired, improved metal adhesion polypropylene film of the present invention. The ratio or proportion by weight of polypropylene to acid terpolymer is workable in the range of 99.5/0.5 to 0/100. It is possible, though not recommended, to eliminate the polypropylene. The preferred ratio of polypropylene to acid terpolymer is in the range of 95/5 to 75/25 with the best results achieved in the range of 90/10 to 80/20.

The polypropylene/acid terpolymer blend can be achieved by mechanically blending the acid terpolymer pellets of a size approximately one eighth of an inch in diameter with the polypropylene resin pellets in the desired ratio. This blend is then fed to an extruder preferably on a biaxially orienting film line. Alternatively, a process known as compounding, wherein the two resins are fed into an extruder in the desired ratio, melted together and extruded into a new resin blended pellet wherein the new blended resin pellet is a composition of the acid terpolymer and polypropylene, can be employed. Both of these methods of blending work equally well with regards to the finished film characteristics of increased metal adhesion.

Biaxial orientation of the resultant film is preferred. Methods for biaxially orienting films are of common knowledge and in widespread use by plastic film manufacturers. Biaxially orienting refers to the orienting of the film's crystalline structure in two directions. These two directions are referred to as the machine direction and the transverse direction. The two most common processes for biaxially orienting films are the Flat Die-Tentering Frame Process and the Double Bubble Process. Both processes also normally involve heat setting the oriented film.

The Flat Die-Tentering Frame Process produces biaxially oriented film by feeding a flat die, with one or more extruders, with the polypropylene/acid terpolymer blend. The molten plastic sheet is solidified by extrusion onto a chilled drum. This solidified sheet is then stretched in the machine direction by a series of rolls which are moving at a higher line speed than the chilled drum. The stretched sheet, or web, is then oriented in a transverse direction by the tentering portion of the machine. This tentering portion clamps onto the two edges of the web to control the width dimension of the web. The web then passes into an oven where it is heated so that it can be stretched. The clamps attached to the web ride on diverging rails and subsequently stretch the film, width-wise, in a controlled manner. At this time the film is usually heat set. To achieve the desired improvement in metal adhesion regardless of the final film layers the outside layer must contain the acid terpolymer. The biaxially oriented film is then wound into roll form.

The sequence of machine direction orientation and transverse direction orientation can be reversed or done on separate machines without any difference resulting in the metal adhesion properties of the film.

The Double Bubble Process consists of an extruder or extruders feeding a tubular die. Each extruder feeds a material which becomes one or more layers of the final film structure. Therefore, with regards to this invention one of the extruders would be feeding the polypropylene/acid terpolymer blend to the die. To achieve the desired improvement in metal adhesion, regardless of the final number of film layers, the outside layer is the layer required to contain the acid terpolymer.

The molten plastic exits the die in the shape of a tube which is then solidified by quenching, for example, in water or air. This solidified tube is then pulled to the top of a biaxially orienting machine where it is reheated and softened. This softened tube is then inflated with air and is blown into a bubble of cylindrical shape. The bottom of the bubble is pulled through the machine at a much higher rate than the tube which is feeding the top of the bubble, thereby orienting the film in the machine direction. The process of heating the tube and blowing the bubble causes orienting of the film in the transverse direction.

The bubble is then forced or nipped together at the bottom, thus creating a valve to keep the air in the bubble and keep it inflated. This nipping together of the bubble bottom produces a single web which is then slit at the edges, thus producing two separate sheets of finished film which are wound up on separate rolls. Each roll width is half the bubble circumference.

Regardless of which process is used to biaxially orient the film, or whether the film is oriented or not with regard to this invention, the important thing to note is that the acid polypropylene/terpolymer blend layer is the outside layer of the film. The film could consist of only a single layer or a multitude of layers, so long as the acid terpolymer is contained in the outside layer, not sandwiched or buried between other layers.

Preferably this film is then treated by corona discharge, a known electrostatic surface treatment to further improve its reception of and adhesion to a metal covering layer. However, surface treatment is not a necessity. This film is then metallized. Metallization preferably is done by vacuum vapor deposition. The film is passed over a source of metal vapor, preferably aluminum, with the acid terpolymer containing layer facing the source of the metal vapor. The metal vapor condenses on the film and produces a thin coating of metal on the polypropylene/acid terpolymer layer of the film. The film is then cooled by contact with water cooled heat transfer rolls and the film is rewound into a roll.

ACHIEVEMENTS OF THE INVENTION

An outstanding feature of the invention is manifested in the surprisingly high degree of adhesion between the metal and the polypropylene/acid terpolymer blend layer. The improved metal adhesion of the film is evidenced by comparing the adhesive strength of a film containing the polypropylene/acid terpolymer blend with a film that does not contain the acid terpolymer/polypropylene blend. The adhesive strength of one film tested containing the acid terpolymer blend was 130 grams/inch. In contrast, the adhesive strength of a film tested that did not contain the polypropylene/acid terpolymer blend was only 20 grams/inch. This metallized film also exhibits a much higher resistance or cracking of the metallized surfaces during subsequent film processing than would normally be expected. For instance, the amount of cracking is not as great during extrusion lamination. In extrusion lamination the metallized film is used as a base film in which molten polymer, usually polyethylene, is extruded onto the metallized surface of the metallized polypropylene film containing the polypropylene/acid terpolymer blend layer. This molten polyethylene acts as an adhesive to join the metallized film to another secondary web.

Various features of the invention have been particularly shown and described in connection with the illustrated embodiments of the invention, however, it must be understood that these particular arrangements merely illustrate, and that the invention is to be given its fullest interpretation within the terms of the appended claims.

What is claimed:

1. A plastic film having improved adhesion properties as a substrate for a coating of a metal, said film comprising a blend of polypropylene and an acid terpolymer comprising an ester monomer, an acidic monomer and ethylene.

2. The plastic film of claim 1 on which is deposited a thin layer of metal.

3. The plastic film of claim 2 in which said thin layer of metal is deposited on said plastic film by vacuum vapor deposition.

4. The plastic film of claim 1 wherein said ester monomer is selected from the group consisting of: methyl acrylate, alkyl methacrylates wherein the alkyl group contains 1 through 8 carbons and alkyl hydrogen maleates wherein the alkyl group contains 1 through 8 carbons.

5. The plastic film of claim 4 wherein said acidic monomer is selected from the group consisting of: acrylic acid, methacrylic acid and maleic acid.

6. The plastic film of claim 1 wherein the proportion by weight of said polypropylene to said acid terpolymer is in the range of from 99.5/0.5 to 0.5/99.5.

7. The plastic film of claim 1 wherein the proportion by weight of said polypropylene to said acid terpolymer is in the range of from 95/5 to 75/25.

8. The plastic film of claim 1 wherein the proportion by weight of said polypropylene to said acid terpolymer is in the range of from 90/10 to 80/20.

9. The plastic film of claim 1 wherein said film is biaxially oriented.

10. The plastic film of claim 1 wherein said polypropylene is heat set.

11. The plastic film of claim 1 wherein said film has a surface that has been subjected to electrostatic surface treatment to improve the adhesion properties thereof.

* * * * *